United States Patent
Brewer (10) Patent No.: US 7,622,813 B2
(45) Date of Patent: Nov. 24, 2009

(54) ORIENTED SELF-LOCATION OF MICROSTRUCTURES WITH ALIGNMENT STRUCTURES

(75) Inventor: Peter D. Brewer, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 216 days.

(21) Appl. No.: 11/789,233

(22) Filed: Apr. 23, 2007

(65) Prior Publication Data

US 2007/0252289 A1   Nov. 1, 2007

Related U.S. Application Data

(62) Division of application No. 10/888,169, filed on Jul. 8, 2004, now Pat. No. 7,223,635.

(60) Provisional application No. 60/490,193, filed on Jul. 25, 2003.

(51) Int. Cl.
H01L 23/544 (2006.01)
H01L 23/02 (2006.01)

(52) U.S. Cl. .................. 257/797; 257/678; 257/726; 438/106; 438/107

(58) Field of Classification Search .............. 257/678, 257/723–726, 797; 438/106, 107
See application file for complete search history.

(56) References Cited

U.S. PATENT DOCUMENTS

| 4,912,844 | A |   | 4/1990  | Parker ......................... 29/848 |
| 5,032,896 | A |   | 7/1991  | Little et al. ................. 257/686 |
| 5,161,093 | A |   | 11/1992 | Gorczyca et al. ............ 361/414 |
| 5,284,548 | A |   | 2/1994  | Carey et al. ................. 156/630 |
| 5,312,765 | A |   | 5/1994  | Kanber ........................ 437/22 |
| 5,324,687 | A |   | 6/1994  | Wojnarowski .............. 438/107 |
| 5,353,498 | A |   | 10/1994 | Fillion et al. ................. 29/840 |
| 5,485,038 | A |   | 1/1996  | Licari et al. ................. 257/758 |
| 5,489,554 | A |   | 2/1996  | Gates .......................... 437/208 |
| 5,545,291 | A | * | 8/1996  | Smith et al. ................. 438/107 |
| 5,609,907 | A |   | 3/1997  | Natan ........................ 427/2.12 |
| 5,751,018 | A |   | 5/1998  | Alivisatos et al. ............. 257/64 |
| 5,772,905 | A |   | 6/1998  | Chou .......................... 216/44 |
| 5,783,856 | A |   | 7/1998  | Smith et al. ................. 257/618 |
| 5,800,650 | A |   | 9/1998  | Anderson et al. ........... 156/150 |

(Continued)

FOREIGN PATENT DOCUMENTS

EP    0 982 385 A1    3/2000

(Continued)

OTHER PUBLICATIONS

U.S. Appl. No. 10/888,178 by Brewer et al., filed Jul. 8, 2004.

(Continued)

*Primary Examiner*—Marcos D. Pizarro
*Assistant Examiner*—Raj Gupta
(74) *Attorney, Agent, or Firm*—Ladas & Parry (57) ABSTRACT

An electronic apparatus comprising one or more microstructures on a substrate and a method for fabricating the electronic apparatus. The microstructures have alignment structures that allow the microstructures to be oriented in receptacles having shapes that are complementary to the shapes of the alignment structures. The alignment structures are shapes that vary when rotated 360°, such that the microstructures are positioned at a specific orientation in the receptacles.

25 Claims, 8 Drawing Sheets

U.S. PATENT DOCUMENTS

| | | | | |
|---|---|---|---|---|
| 5,824,186 | A | 10/1998 | Smith et al. | 156/655.1 |
| 5,861,670 | A | 1/1999 | Akasaki | 257/737 |
| 5,877,550 | A | 3/1999 | Suzuki | 257/700 |
| 5,904,545 | A | 5/1999 | Smith et al. | 438/455 |
| 6,037,255 | A | 3/2000 | Hussein et al. | 438/675 |
| 6,096,386 | A | 8/2000 | Biebuyck et al. | 427/510 |
| 6,130,823 | A | 10/2000 | Lauder et al. | 361/760 |
| 6,165,911 | A | 12/2000 | Calveley | 438/754 |
| 6,294,741 | B1 | 9/2001 | Cole, Jr. et al. | 174/260 |
| 6,326,058 | B1 | 12/2001 | Biebuyck et al. | 427/261 |
| 6,417,025 | B1 | 7/2002 | Gengel | 438/107 |
| 6,479,395 | B1 | 11/2002 | Smith et al. | 438/723 |
| 6,500,694 | B1 | 12/2002 | Enquist | 438/109 |
| 6,507,989 | B1 * | 1/2003 | Bowden et al. | 29/592.1 |
| 6,541,346 | B2 | 4/2003 | Malik | 438/316 |
| 6,579,463 | B1 | 6/2003 | Winningham et al. | 216/41 |
| 6,611,237 | B2 | 8/2003 | Smith | 343/772 |
| 6,652,808 | B1 | 11/2003 | Heller et al. | 422/68.1 |
| 6,656,568 | B1 | 12/2003 | Winningham et al. | 428/145 |
| 6,657,289 | B1 * | 12/2003 | Craig et al. | 257/678 |
| 2002/0005294 | A1 | 1/2002 | Mayer et al. | 174/260 |
| 2002/0019068 | A1 * | 2/2002 | Ericson et al. | 438/27 |
| 2002/0045030 | A1 | 4/2002 | Ozin et al. | 428/173 |
| 2003/0062123 | A1 | 4/2003 | Hunter et al. | 156/310 |
| 2003/0068519 | A1 | 4/2003 | Brewer et al. | 428/620 |
| 2003/0112576 | A1 | 6/2003 | Brewer et al. | 361/119 |
| 2003/0140317 | A1 | 7/2003 | Brewer et al. | 716/1 |
| 2004/0016998 | A1 * | 1/2004 | Fonstad et al. | 257/678 |

FOREIGN PATENT DOCUMENTS

| | | |
|---|---|---|
| JP | 10-022338 | 1/1998 |
| WO | 01/33300 A2 | 5/2001 |

OTHER PUBLICATIONS

Bobbio, S.M., et al., "Integrated Force Arrays," *IEEE Proceedings of the Workshop on Micro Electro Mechanical Systems (MEMS)*, Fort Lauderdale, pp. 149-154 (Feb. 7-10, 1993).

Böhringer, K.F., et al., "Modeling of Capillary Forces and Binding Sites For Fluidic Self-Assembly," *MEMS: 2001: The 14th IEEE International Conference on Micro Electro Mechanical Systems*, pp. 369-374 (2001).

Borzenko, T., et al., "Polymer Bonding Process for Nanolithography," *Applied Physics Letters*, vol. 79, No. 14, pp. 2246-2248 (Oct. 1, 2001).

Chou, S.Y., et al., "Imprint of Sub-25 nm Vias and Trenches in Polymers," *Appl. Phys. Lett.*, vol. 67, No. 21, pp. 3114-3116 (Nov. 20, 1995).

Chou, S.Y., et al., "Nanoimprint Lithography," *J. Vac. Sci. Technol. B*, vol. 14, No. 6, pp. 4129-4133 (Nov./Dec. 1996).

Cohn, M.B., et al., "Microassembly Tehnologies For MEMS," *SPIE Micromachining and Microfabrication, Conference on Micromachining and Microfabrication Process Technology IV*, Santa Clara, CA, 15 pages total (Sep. 21-22, 1998).

Gracias, D.H., "Forming Electrical Networks In Three Dimensions by Self-Assembly," *Science*, vol. 289, pp. 1170-1172 (Aug. 18, 2000).

Hadley, M.A., "Vertical-Cavity Surface-Emitting Laser Diodes: Design, Growth, Mode Control and Integration by Fluidic Self-Assembly," *UMI Dissertation Services*, Sections 5.4, 5.5, and 5.6, pp. 75-81 (1994).

Hao, E., et al., "Buildup of Polymer/Au Nanoparticle Multilayer Thin Films Based on Hydrogen Bonding," *Chem. Mater.*, vol. 12, No. 11, pp. 3392-3396 (2000).

Kumar, A., et al., "Pattering Self-Assembled Monolayers: Applications in Materials Science," *Langmuir*, vol. 10, No. 5, pp. 1498-1511 (1994).

"Method to Control the Geometry and Vertical Profile of Via Holes in Substrate Materials," *IBM Technical Disclosure Bulletin*, vol. 35, No. 5, pp. 211-216 (Oct. 1992).

Saitou, K., et al., "Externally Resonated Linear Microvibromotor For Microassembly," *Journal of Microelectromechanical Systems*, vol. 9, No. 3, pp. 336-346 (Sep. 2000).

Srinivasan, U., et al., "Fluidic Self-Assembly of Micromirrors onto Surface Micromachined Actuators," *IEEE*, pp. 59-60, (2000).

Srinivasan, U., et al., "Microstructure to Substrate Self-Assembly Using Capillary Forces," *Journal of Microelectromechanical Systems*, vol. 10, No. 1, pp. 17-24 (Mar. 2001).

Terfort, A., et al, "Self-Assembly Of An Operating Electrical Circuit Based on Shape Complementarity And The Hydrophobic Effect," *Advanced Materials*, vol. 10, No. 6, pp. 470-473, (1998).

Terfort, A., et al., "Three-dimensional Self-Assembly of Millimetre-Scale Components," *Nature*, vol. 386, pp. 162-164 (Mar. 13, 1997).

Tormen, M., et al., "Thermocurable Polymers as Resists for Imprint Lithography," *Electronics Letters*, vol. 36, No. 11, pp. 983-984 (May 25,2000).

"Use of High Precision Silicon Molds for Replicating Microelectronic Packaging Structures," *IBM Technical Disclosure Bulletin*, vol. 30, No. 5, pp. 306-311 (Oct. 1987).

Zhang, W., et al., "Multilevel Nanoimprint Lithography with Submicron Alignment Over 4 in. Si Wafers," *Applied Physics Letters*, vol. 79, No. 6, pp. 845-847 (Aug. 6, 2001).

Bains, S., "Circuit Blocks Attached Via DNA," Electronic Engineering Times, pp. 39-44 (Mar. 9, 1998).

Bains, S., "Double Helix Doubles as Engineer," Science, vol. 279, pp. 2043-2044 (Mar. 27, 1998).

* cited by examiner

ORIENTED SELF-LOCATION OF MICROSTRUCTURES WITH ALIGNMENT STRUCTURES

CROSS-REFERENCE TO RELATED APPLICATIONS

This application is a division of U.S. patent application Ser. No. 10/888,169, filed on Jul. 8, 2004, now U.S. Pat. No. 7,223,635 which is related to and claims benefit under 35 U.S.C. 119(e) to U.S. Provisional Application No. 60/490,193, titled "Oriented Self-Location of Microstructures with Alignment Structures," filed Jul. 25, 2003. The contents of U.S. Provisional Application No. 60/490,193 are incorporated herein by reference in their entirety.

The present disclosure is related to the following copending and commonly assigned United States patent applications, all of which are incorporated herein by reference in their entireties: "Method For Assembly of Complementary-Shaped Receptacle Site and Device Microstructures," U.S. patent application Ser. No. 10/218,052, filed Aug. 12, 2002, now U.S. Pat. No. 7,018,575; "Process for Producing High Performance Interconnects," U.S. patent application Ser. No. 10/256,334, filed Sep. 26, 2002; and "Process For Assembling Three-Dimensional Systems On A Chip And Structure Thus Obtained," U.S. patent application Ser. No. 10/256,336, filed on Sep. 26, 2002. The present disclosure is also related to the and commonly assigned U.S. provisional patent application "Improved Self-Location Apparatus," Ser. No. 60/490,194, filed on Jul. 25, 2003 and incorporated herein by reference in its entirety. The present disclosure is also related to the and commonly assigned U.S. patent application "Improved Self-Location Apparatus," Ser. No. 10/888,178 filed on Jul. 8, 2004; now U.S. Pat. No. 7,105,376, and incorporated herein by reference in its entirety.

BACKGROUND

1. Field

The present disclosure relates to the assembly of device and integrated circuit components on a substrate to provide hybrid electronic, optoelectronic, or other types of integrated electronic systems. For example, the present disclosure describes a method for fabricating arbitrarily configured arrays of devices or components on host circuits or substrates with a specific orientation using fluid-based transport or other mass dispersing techniques.

2. Description of Related Art

Increasingly complex integrated electronic and optoelectronic systems require larger numbers of integrated circuits and devices to implement increasingly complex system functions. However, to achieve cost and weight goals, it is preferred that these integrated systems be implemented with as few separate device structures as possible. One approach is to fabricate all of the integrated circuits and devices on a single wafer or portion of a wafer, which provides the structural base for the system and minimizes the interconnect distances between circuits and devices. Such fabrication may be referred to as "wafer-scale" integration.

Many complex integrated electronic and optoelectronic systems require the use of integrated circuits and devices that utilize different semiconductor technologies. One approach known in the art for wafer-scale integration of different semiconductor technologies is heteroepitaxy. The heteroepitaxy approach may limit the number of different devices and material systems that can be successfully integrated. Moreover, growth and fabrication procedures optimized for a single device technology often must be compromised to accommodate dissimilar material systems. Finally, testing of individual portions of the integrated system may be made difficult by the fabrication techniques used to accommodate dissimilar material systems on a single wafer.

Since it may be difficult to fabricate high performance systems using multiple device types using heteroepitaxy approaches, it may be preferable to fabricate separate arrays of devices or circuit modules and couple these separately fabricated components to a host wafer. This approach allows each individual component to have state-of-the-art performance and high yield (due to pre-testing). Each component may use proven device and circuit architectures, while optimum epitaxial growth and/or device processing sequences are employed to fabricate each component.

The separate components may be individually integrated with the host wafer using any one of several established methods for chip-level integration. These methods generally rely upon surface-mounting techniques for attaching complete die assemblies using solder bumps or wire bonding. The most advanced of these methods is the "flip-chip" technique that can support integration of a wide variety of device technologies and fully utilizes the costly, high-performance device wafer real estate. However, flip-chip is generally limited to relatively large size components, typically greater than 1 square millimeter, and is inefficient for the placement of large numbers of components due to its serial nature.

At the wafer-scale level, self-assembly methods provide the best capability to allow integration of arbitrary configurations and densities of components. The most advanced of the self-assembly methods use a fluid medium to transport components to a host substrate or wafer for assembly. Two different fluidic self-assembly methods are known in the art, which differ in the underlying mechanism used to locate, position, and connect the components on the host substrate or wafer.

The first method of fluidic self-assembly uses gravitational forces and geometrical constraints to integrate components with a host substrate. The components are fabricated with specific shapes and complementary shaped receptacles are formed on the substrate for receiving the shaped components. The components are typically formed using semiconductor fabrication techniques and the receptacles are formed by using wet or dry etching techniques. A solvent such as water or ethanol is used to transport the individual components to the host substrate with the receptacles. The receptacles trap the components, which come to rest in predictable orientations due to their specific shapes. The driving potential is primarily gravitational in origin, but the fluid and surface forces may also play a role in the assembly process.

The second method of fluidic self-assembly utilizes chemically-based driving forces to govern the assembly process, where the attraction, positioning, orientation, and ordering of components is controlled by molecular interactions at the surfaces of the components and the host substrate. Molecular-based self-assembly techniques generally use surface coatings that consist of chemically-bonded films which are either hydrophobic or hydrophilic by nature. Thermodynamic driving forces control the assembly of complex arrays of components by minimizing the surface energies of the components and host substrate.

Both methods may be used together to provide for integration of electronic and opto-electronic devices into hybrid electronic systems. See, for example, A. Terfort, et al., "Self-Assembly of an Operating Electrical Circuit Based on Shape Complementarity and the Hydrophobic Effect," *Adv. Material,* 10, No. 6, 1998, pp. 470-473. See also A. Terfort, et al., "Three-dimensional Self-Assembly of Millimeter-scale Components," *Nature*, Vol. 386, Mar. 13, 1997, pp. 162-164.

Methods for fabricating device microstructures by fluidic self-assembly have also been the subject of various U.S. patent disclosures. For example, U.S. Pat. No. 5,545,291, which is incorporated herein by reference in its entirety, describes one such method comprising the steps of providing a plurality of shaped blocks, each shaped block comprising an integrated circuit thereon; transferring said shaped blocks into a fluid to form a slurry, and dispensing said slurry over a substrate at a rate where at least one of said shaped blocks is disposed into a recessed region in the substrate. In the '291 patent, the substrate is selected from a group consisting of a silicon wafer, plastic sheet, gallium arsenide wafer, glass substrate, and ceramic substrate. The flow is substantially a laminar flow and the rate of flow allows each of the shaped blocks to self-align into the recessed region.

Figure 1:
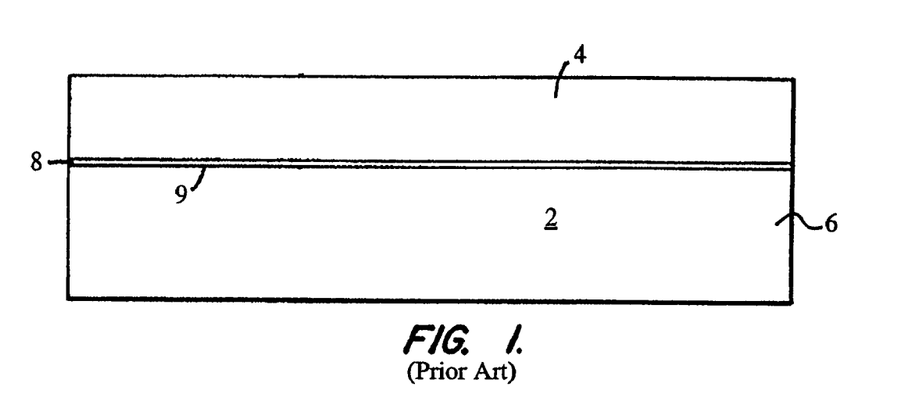
FIG. 1 is a semiconductor substrate used in a prior art process for fabricating shaped blocks with integrated circuits thereon.
Figure 2:
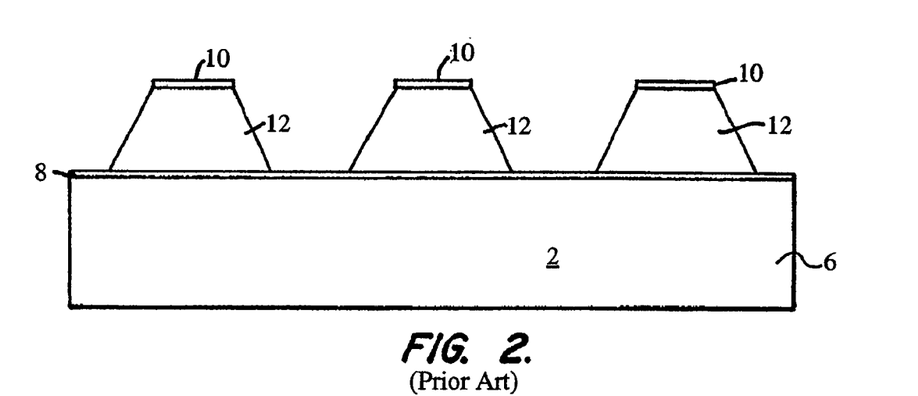
FIG. 2 is an illustration of prior art blocks etched from the substrate of FIG. 1.
Figure 3:
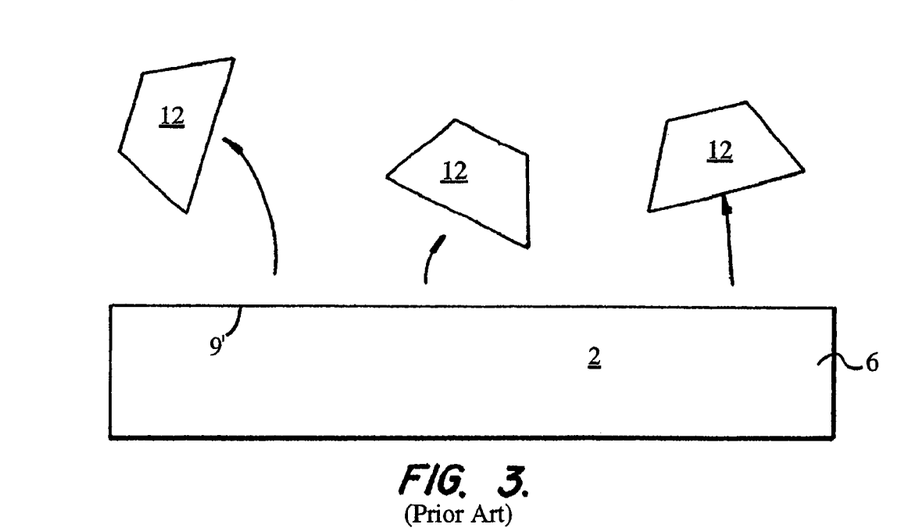
FIG. 3 is an illustration of the prior art blocks of FIG. 2 being removed from the substrate.

In the '291 patent, the blocks comprising the integrated circuit device thereon are shaped by masking and etching. Referring to FIGS. 1 to 3 of the attached drawings, a block substrate 2 is provided with a top layer, a bottom layer 6 and a sacrificial layer 8 atop the top surface of the bottom layer 6 (see FIG. 1). The blocks are shaped by masking and etching the top layer using known techniques to form the etched block substrate shown in FIG. 2 comprising photoresist layer 10 atop shaped blocks 12. Then the shaded blocks 12 are removed by preferential etching of sacrificial layer 8 (see FIG. 3). The removed blocks 12 (see FIG. 3) are then mixed with an inert fluid to form a slurry and the slurry is deposited on the top surface of a substrate comprising recessed regions to allow the blocks to self-align in the recessed regions of the substrate.

To insure proper placement and registration of the microstructures in the recessed regions, the recessed regions in the prior art substrates have been etched to provide receptacle sites with geometric profiles that are complementary to the profiles of the blocks. Receptacle sites in other reports of fluidic self-assembly have also been made by etching recesses in the surface of silicon substrates. Single crystalline silicon can be etched by a number of methods to produce a variety of sidewall profiles. The etching behavior of most wet-processes can be categorized as isotropic or crystallographic. Receptacles fabricated using crystallographic etches are the most favorable for forming receptacle sites.

Crystallographically etched receptacles in a silicon substrate have been obtained by using an aqueous potassium hydroxide (KOH) solution. It is difficult to produce complementary shapes between receptacles and device microstructures using KOH etch techniques, because the microstructures require an exterior surface etch and the receptacles require an interior surface etch. The best results for shape matching have been achieved using corner compensation masking techniques for etching the device microstructure. These techniques prevent the corners from being rounded. However, in general, the microstructures are found to be etched with a more tapered shape than the receptacle sites. This leads to a loose fit.

A layer of polymer material may be used as the substrate in which receptacles are formed. The receptacles in the polymer material may be formed using plasma etching. Methods for forming tapered holes in polyimide are well-known in the art. The methods for forming tapered sidewalls typically involve using specially prepared photoresist masks (tapered erosion masks). These methods are typically limited to several microns of depth because the masking material and the polymer etch at the same rate.

Another method for forming receptacles in polymer material is disclosed in the commonly assigned and copending application "Method For Assembly of Complementary-Shaped Receptacle Site and Device Microstructures," U.S. application Ser. No. 10/218,052. This application describes a method for forming receptacles by first creating a mold having a protuberance with the same shape as a protuberance on a device microstructure. The mold is then applied to a moldable substrate, typically a polymer material, to form a receptacle site having a complementary shape to the protuberance on the device microstructure. Fluidic self-assembly is then used to provide the device microstructure to the molded substrate, and the device microstructure then self-aligns in the recess. Typically, the mold will have multiple protuberances so that multiple recesses will be formed in the moldable substrate when molded with the mold.

The three dimensional shapes of the shaped blocks comprising the microstructures or parts thereof and the complementarily-shaped receptacles described in the prior art are generally invariant under 360 degree rotation. That is, the shapes generally have no specific orientation in the plane defined by the surface containing the receptacles. Hence, when the microstructures are positioned within the receptacles, the microstructures may be oriented within the receptacle in any one of several orientations defined by the receptacle shape. For example, a receptacle having a square shape, that is, a shape with four equal length sidewalls, would allow a microstructure to be positioned in any one of four different orientations. Variations in the orientations of the microstructures positioned within the receptacles complicates the steps needed to make electrical, optical, or other types of connections to the microstructures. The variations in the orientations may also limit or complicate the electrical or optical designs implemented by the microstructures.

The three-dimensional shapes of the shaped blocks comprising the microstructures or portions thereof and the complementarily shaped receptacles may also hinder the self-alignment capabilities of the microstructures. Due to these shapes, a microstructure may be introduced in a skewed fashion to the corresponding receptacle, causing the microstructure to become stuck in the receptacle, but not properly seated in the receptacle. Those skilled in the art will understand that this problem is more likely to be seen with shapes that have well-defined corners than with shapes that have more curved features.

Therefore, there exists a need in the art for providing a method and structure that facilitates the assembly of microstructures within receptacles in a structure in a preferred orientation. There also exists a need in the art for providing a method and structure that facilities such assembly while avoiding the assembly of microstructures in a skewed manner that prevents proper seating of the microstructures.

SUMMARY

Embodiments of the present invention provide an electronic apparatus that comprises one or more microstructures positioned within a substrate in which the microstructures have a specific orientation. Embodiments of the present invention also provide a method for assembling microstructures on a substrate with a specific orientation. The orientation of the microstructures on the substrate is facilitated by the formation of alignment structures on the microstructures with contours that vary when the alignment structures are rotated 360° in a plane parallel to the substrate. The alignment structures are positioned within complementary-shaped receptacles in the substrate.

A first embodiment of the present invention is an electronic module that comprises: a device microstructure having an alignment structure, the alignment structure having a selected size and shape; and a substrate having at least one receptacle, the at least one receptacle having a size and shape complementary to the size and shape of the alignment structure, where the device microstructure is configured to be seated within the at least one receptacle at a single orientation, the single orientation of the microstructure based on the shape of the alignment structure and the shape of the complementary-shaped receptacle.

Another embodiment of the present invention is a method for fabricating an electronic module that comprises: forming an alignment structure on a device microstructure, the alignment structure having a selected size and shape; forming one or more receptacles in a substrate, the one or more receptacles having a size and shape complementary to the size and shape of the alignment structure; and seating the alignment structure in one complementary-shaped receptacle of the one or more receptacles at a single orientation, the orientation of the alignment structure based on the shape of the alignment structure and the shape of the complementary-shaped receptacle.

DETAILED DESCRIPTION

The present invention will now be described more fully hereinafter with reference to the accompanying drawings, in which preferred embodiments of the invention are shown. This invention may be embodied in many different forms and should not be construed as limited to the embodiments set forth herein. Further, the dimensions of layers and other elements shown in the accompanying drawings may be exaggerated to more clearly show details. The present invention should not be construed as being limited to the dimensional relations shown in the drawings, nor should the individual elements shown in the drawings be construed to be limited to the dimensions shown.

According to an embodiment of the present invention, a method for assembling device and integrated circuit components on a substrate with a specific orientation using fluid-based transport or other mass dispersing techniques is provided. Specific orientations are accomplished by using uniquely shaped alignment structures fabricated in the surface of a component that are "keyed" to corresponding receptacles on a substrate. Hence, this embodiment facilitates precise location and orientation of components on the substrate. Embodiments of the present invention may provide that the shape of the component provides the alignment structure. However, it is preferred that the alignment structure is created without shaping the component itself.

As used herein, "component" is used interchangeably with "microstructure," "integrated circuit component," "electronic device," or "semiconductor structure" and generally refers to devices fabricated by semiconductor techniques that are to be assembled on a separate host structure. Further, as used herein, "receptacle" is used interchangeably with "receptacle site" and generally refers to a region on the host substrate at which the component is to be positioned.

According to an embodiment of the present invention, alignment structures are formed on semiconductor structures such that the alignment structures fit into corresponding receptacles in a substrate. The description below first describes a molding method that may be used to form the alignment structures, where the alignment structures comprise molded polymer materials. Those skilled in the art will understand that other methods may be used to form alignment structures in accordance with embodiments of the present invention. A molding process that may be used for forming the receptacles is then described. Again, those skilled in the art will understand that other processes may be used to provide receptacles. Finally, some of the shapes of the alignment structures and corresponding receptacles that may be used in accordance with embodiments of the present invention are described. Those skilled in the art will understand that the specifically described shapes are not the only shapes for the alignment structures and receptacles in accordance with the present invention.

Forming the Alignment Structures

A method for providing microstructures with alignment structures in accordance with an embodiment of the present invention is illustrated in FIGS. 4A-4I. In this method, a stamped polymer structure is used to provide the geometric patterns for the alignment structures that facilitates the assembly of individual microstructures on a substrate containing receptacles. Methods for applying and stamping a polymer layer are described in U.S. patent application Ser. No. 10/256,334, "Process for Producing High Performance Interconnects," filed Sep. 26, 2002; U.S. patent application Ser. No. 10/218,052, "Method for Assembly of Complementary-Shaped Receptacle Site and Device Microstructures," filed Aug. 12, 2002; and U.S. patent application Ser. No. 10/256,336, "Process for Assembling Three-Dimensional Systems on a Chip and Structure Thus Obtained," filed Sep. 26, 2002. FIGS. 4A-4I present an exemplary method for using stamped polymer structures to provide microstructures with geometrically shaped alignment structures, but other methods for using stamped polymer structures may also provide the desired alignment structures.

Figure 4A:
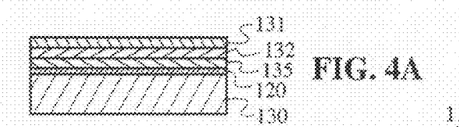
FIGS. 4A-4I illustrate steps for forming embodiments of the alignment structures according to the present invention.

FIG. 4A illustrates the growth of a semiconductor-based microstructure with multiple epitaxial layers 131, 132, 135 on an appropriate substrate 130 with an optional etch stop layer 120. The multiple epitaxial layers 131, 132, 135 generally comprise electrically active semiconductor layers fabricated specifically for particular device characteristics. Molecular beam epitaxy (MBE), Metal Organic Chemical Vapor Deposition (MOCVD), or other semiconductor fabrication techniques known in the art may be used to grow the microstructure with the multiple layers 131, 132, 135. The substrate 130 may comprise a substrate wafer made of materials preferably chosen to closely match the lattice parameters of the epitaxially grown layers 131, 132, 135. The materials for the substrate 130 may comprise GaAs, InP, SiC, $Al_2O_3$, Si, SiGe, GaSb, InSb, CdTe, CdZnTe, or InAs. The multiple epitaxial layers 131, 132, 135 are typically thin, generally ranging from 1 to 10 microns thick, although some structures may have layers thinner or thicker than this range. Further, while the microstructure depicted in FIG. 4A shows three epitaxial layers 131, 132, 135, other microstructures may have more or less than three layers. Finally, while not shown in FIG. 4A, electrical contacts and interdevice interconnects may also be formed during or after the growth of the multiple epitaxial layers 131, 132, 135, along with other device or circuit fabrication steps (e.g., oxidation, passivation, isolation, metalization, etc.).

Figure 4B:
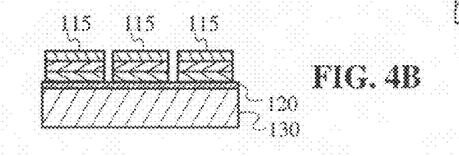

FIG. 4B illustrates the front side delineation of the multiple layer microstructure to form delineated microstructures 115. Known etching techniques, such as reactive ion etch (RIE) or wet chemical etching, may be used to define the perimeters of the delineated microstructures 115. Other delineation techniques known in the art may also be used to provide the delineated microstructures 115. As is discussed in more detail below, the perimeters of the delineated microstructures 115 do not have to be precisely defined for self-assembly, as is required by some prior art methods, since the locations or orientations of the microstructures do not depend on the shapes of the delineated microstructures 115.

Figure 4C:
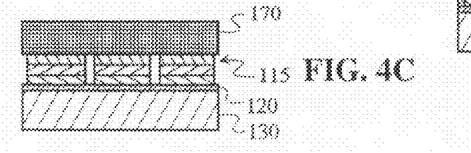

FIG. 4C illustrates the application of a polymer layer 170. The polymer layer 170 may be applied to the tops of the delineated microstructures 115 using techniques known in the art, such as a spin-on process using a commercial photoresist spinner. The polymer layer 170 may comprise moldable materials known in the art, such as SU-8 photoepoxy, benzocyclobutene, polyimide, or other such materials.

Figure 4D:
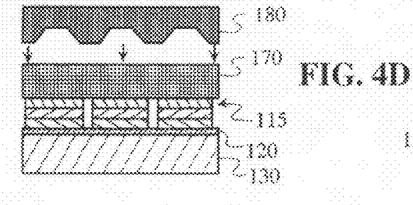
Figure 4E:
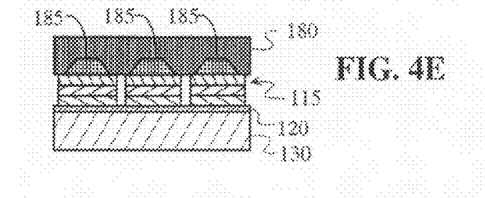

FIG. 4D shows the positioning of a shaping wafer 180 above the polymer layer 170. FIG. 4E shows the application of the shaping wafer 180 into the polymer layer 170 to form alignment structures 185 above the delineated microstructures 115. The shaping wafer 180 typically comprises a semiconductor substrate on which semiconductor fabrication techniques may be used to form a stamp pattern to create the geometrically patterned alignment structures 185. As shown in FIG. 4E, the shaping wafer 180 is applied to the polymer layer 170 with sufficient pressure and at a suitable temperature so as to form the alignment structures 185. The same procedures and techniques discussed below for forming receptacles may also be use in stamping and molding the polymer layer 170.

Figure 4F:
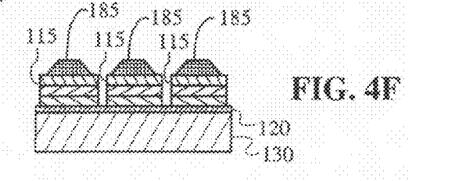

After the alignment structures 185 are formed in the polymer layer 170, the shaping wafer 180 is removed and additional processes are used to remove any residual polymer material outside of the alignment structures 185 from the polymer layer 170. FIG. 4F shows the delineated microstructures 115 with the alignment structures 185 after the removal of the polymer residue.

Figure 4G:
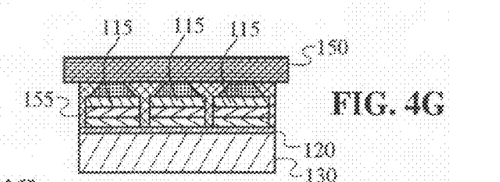

FIG. 4G illustrates the attachment of a handle wafer 150. A wax, dry resist, adhesive, spin-on-glass, or other temporary bonding material is applied as a filler layer 155 over the delineated microstructures 115. The filler layer 155 is preferably made from materials that are easily dissolved, to facilitate the release of the delineated microstructures 115 to provide individual microstructures 110, as discussed below. The handle wafer 150 is applied on top of the filler layer 155. The handle wafer 150 facilitates the additional processing used to release the delineated microstructures 115. The handle wafer 150 may contain groove or via hole structures to allow penetration of a solvent or other material used to dissolve the temporary bonding material in the filler layer 155.

Figure 4H:
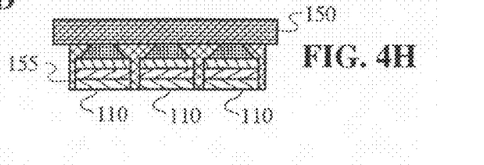

FIG. 4H illustrates the removal of the substrate 130 and the optional etch stop layer 120. Techniques known in the art may be used to remove these layers. Conventional lapping, grinding or chemical-mechanical-polishing may be performed to remove the bulk of the original substrate 130. Then, preferably, selective wet or dry etching is used to remove the substrate 130 and etch stop layer 120 to allow for the separation of the delineated microstructures 115 into the individual microstructures 110.

Figure 4I:
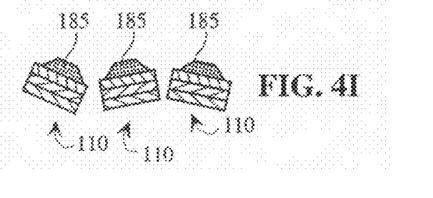

FIG. 4I illustrates the release of the individual microstructures 110 after dissolving the temporary bonding material in the filler layer 155 by solvent exposure. Preferably, the solvent is replaced with an appropriate assembly medium to facilitate the transfer of the individual microstructures 110 to a substrate having receptacles.

Another method for forming semiconductor structures with alignment structures having specific geometric patterns is shown in FIGS. 12A-12H. In this method, a photolithographic process is used to fabricate an alignment key structure or assembly structure from a polymer layer on a semiconductor structure. The alignment key structure or assembly structure then facilitates the location and orientation of the semiconductor structure on an assembly template.

Figure 12A:
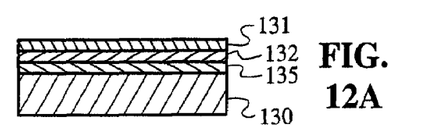
FIGS. 12A-12H illustrate the processing steps used to produce geometrically shaped device or integrated circuit components in accordance with still another embodiment of the present invention.

FIG. 12A illustrates the growth of a semiconductor structure with multiple epitaxial layers 131, 132, 135 on an appropriate substrate 130. As described above, semiconductor fabrication techniques well-known in the art may be used to grow or fabricate the layers. The substrate 130 may also comprise the substrate materials discussed above.

Figure 12B:
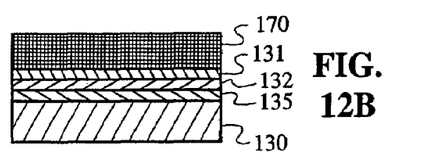

FIG. 12B illustrates the application of a polymer layer 170. The polymer layer 170 may be applied to the semiconductor structure using techniques well-known in the art, such as a spin-on process using a commercial photoresist spinner. The polymer layer 170 preferably comprises photoimageable material known in the art, such as SU-8, benzocyclobutene, polyimide, or thick photoresist materials or other such materials.

Figure 12C:
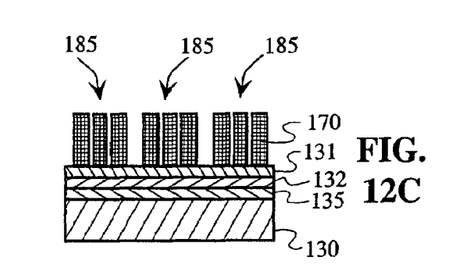

FIG. 12C illustrates the photolithographic patterning of the polymer layer to form the alignment key structures 185. Photolithographic patterning of polymer material is well known in the art. For example, the patterned exposure of the polymer layer 170 to ultraviolet light (wavelength typically between 350 nm and 400 nm) may be used to define the pattern of the alignment key structures 185. The polymer layer 170 may comprise polymer that is negative acting type material (exposed pattern regions remain after the development process) or positive acting type material (unexposed regions of the pattern remain after the development process). The shapes of the alignment key structures may include unique perimeter shapes and interior shapes to aid the capture and alignment of each alignment key structure (and its corresponding semiconductor structure) in the receptacles of the assembly template. The exposure process may be performed using a commercially available lithography system such as the EVG 620 Precision Alignment System from EV Group, Inc. of Schaerding, Austria. Such a system provides that the alignment key structures 185 are formed on the semiconductor structures with preferred micron level precision. Note that the patterning process is performed according to the manufacturer's recipe for a particular polymer material. For example, the normal process for SU-8 comprises the steps of: spin coat; soft bake; patterned exposure, post exposure bake; and develop.

The alignment key structure 185 according to the present invention may comprise more than one layer of polymer material. This would result in an alignment key structure with a more complex three-dimensional shape. For two layer alignment key structures, a two step process may be used in which two layers of polymer material are successively applied and exposed with patterns to result in a two level alignment structure. In this process, the thickness of each of the polymer layers can be independently controlled to create the required key structure. The patterning of the upper and lower layers can be performed with micron-level alignment accuracy relative to one another and to the semiconductor structure itself using commercially available equipment.

Figure 12D:
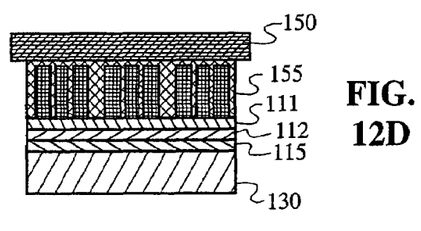

Steps similar to those previously described are used for the application of the handle wafer, the full or partial removal of the substrate 130, and the separation of the individual semiconductor structures 110. FIG. 12D depicts the application of the filler layer 155 and the handle wafer 150. The filler layer 155 and the handle wafer 150 may comprise materials as previously described.

Figure 12E:
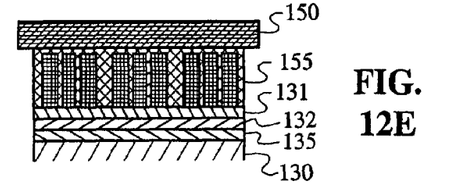

FIG. 12E depicts the partial removal of substrate material from the substrate 130. Conventional lapping, grinding or chemical-mechanical-polishing may be used to remove portions of the substrate materials. Again, some or all of the substrate material may be removed in this step.

Figure 12F:
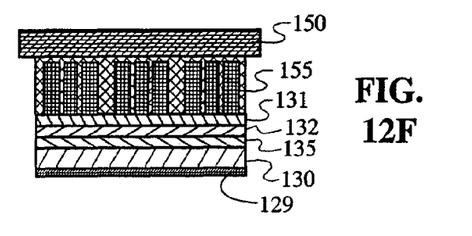

FIG. 12F depicts the deposition of a metal layer 129 to the backside of the substrate layer 130 (or, alternatively, one of the epitaxial layers 135 or an etch stop layer, if the entire substrate is removed). Metalization in this step may facilitate the formation of electrical connections during later steps of the assembly process. The metal layer 129 may comprise Ti, Pt, and/or Au, some combination thereof, or other metal or metal combinations known in the art.

Figure 12G:
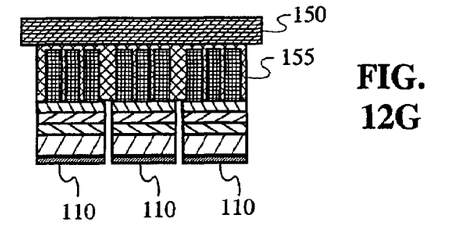

FIG. 12G depicts the delineation of the individual semiconductor structures 110. Conventional techniques, such as scribe and break, wet or dry etching, etc., may be used to perform the delineation of the substrate 130 and multiple epitaxial layers 131, 132, 135 into the individual semiconductor structures 110.

Figure 12H:
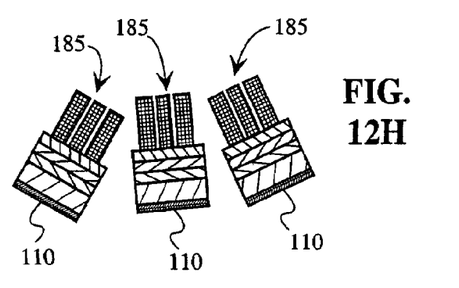

Finally, FIG. 12H depicts the release of the individual semiconductor structures 110 from the handle wafer 150. As described previously, a solvent may be used to dissolve the filler layer 155 to release the structures 110. The solvent may then be replaced with an appropriate assembly medium to facilitate the transport of the individual semiconductor structures to the assembly template.

Forming the Receptacles

Assembly of the individual microstructures 110 formed as discussed above (or by other methods known in the art) on a substrate requires the formation of receptacles on that assembly substrate. That is, the assembly substrate contains receptacles that allow the individual microstructures 110 to be disposed on the assembly substrate at specific locations and with specific orientations.

The assembly substrate may be formed by using semiconductor fabrication techniques well-known in the art to form shaped receptacle areas within a semiconductor substrate. Such techniques are described in U.S. Pat. No. 5,545,291. However, semiconductor fabrication techniques may limit the ability to form complex receptacle shapes in the semiconductor substrate, thus limiting the number of different shapes of individual semiconductor structures that may be positioned in the assembly template.

A preferred method for forming an assembly substrate comprises stamping polymer or SU-8 epoxy films to form shaped receptacles. As noted above, techniques for stamping polymer of SU-8 epoxy films are described in U.S. patent application Ser. No. 10/256,334, U.S. patent application Ser. No. 10/218,052, and U.S. patent application Ser. No. 10/256, 336. FIGS. 5A-5D schematically illustrate a preferred set of process steps to fabricate an assembly substrate 200 using stamping.

Figure 5A:
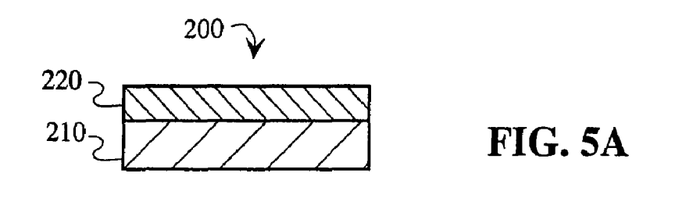
FIGS. 5A-5D illustrate steps for forming embodiments of the complementary-shaped receptacles according to the present invention.

FIG. 5A illustrates a first step where a polymer layer 220 is applied to an assembly substrate wafer 210. The assembly substrate wafer 210 may comprise typical semiconductor wafer materials, such as silicon or gallium arsenide. The polymer layer 220 may be applied to the substrate wafer 210 using techniques known in the art, such as a spin-on process using a commercial photoresist spinner. The polymer layer 220 preferably comprises dielectric materials known in the art, such as SU-8 photoepoxy, benzocyclobutene (BCB), or polyimide.

Figure 5B:
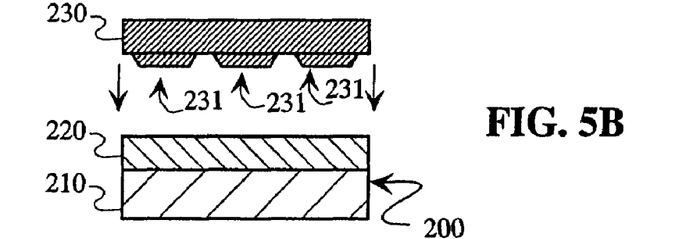

FIG. 5B depicts the provision of a stamp wafer 230 for stamping the polymer layer 220. The stamp wafer 230 contains a stamp pattern 231 that provides for complementary shaped receptacles 221 in the polymer layer 220. Along with the stamp pattern 231 for the shaped receptacles 221, frontside alignment markers (not shown in FIG. 5B) are also preferably formed on the stamp wafer 230 to facilitate alignment of the stamp wafer 230 with the assembly template 200. The stamp pattern 231 may be fabricated using semiconductor manufacturing techniques known in the art, such as photolithographic patterning of the stamp wafer 230 followed by wet-chemical etching or plasma etching techniques. A wide variety of sidewall shapes and angles may be obtained by employing different etching techniques and/or by selecting different crystallographic orientations and masking procedures on the stamp wafer 230.

Figure 5C:
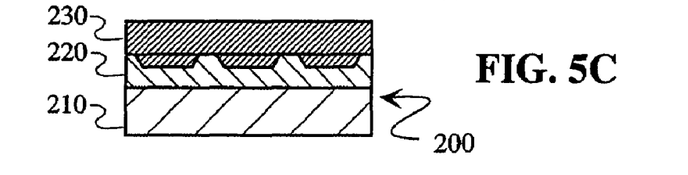

As shown in FIG. 5C, after the stamp wafer 230 with the stamp pattern 231 is prepared, the step of the application of the stamp wafer 230 to the polymer layer 220 on the assembly substrate wafer 210 is performed. The stamp wafer 230 and the assembly substrate wafer 210 are preferably registered to one another using a commercially available alignment tool with front-to-back alignment capability, such as the EV 620 wafer alignment system from EV Group, Inc. of Schaerding, Austria. The wafers 210, 230 are preferably fixed in position to one another using a bonding tool, such as one used with the EV501 wafer bonding machine from EV Group, Inc.

A hot embossing machine, such as an EV520HE hot embossing machine from EV Group, may be used to mold (i.e., imprint) the polymer layer 220 with the stamp pattern 231 on the stamp wafer 230 shown in FIG. 5C. After the stamp wafer 230 and the polymer later 220 are aligned, the bond tool including the bond glass, assembly substrate wafer 210 and stamp wafer 230 are transferred to a hot-embossing system for embossing the polymer layer 220. The embossing process is typically performed under high vacuum conditions with precise temperature and stamping pressure control. The polymer layer 220 may be embossed at low pressures, typically less than 6.9 atmospheres (100 psi) and at a relatively low temperature, typically less than 100° C. However, to emboss, three steps should be performed: 1) heating the stamp wafer 230 and the assembly substrate wafer 210 above the glass transition temperature of the polymer layer 220 (for a polymer layer of SU-8 epoxy, the glass transition temperature is approximately 75° C.); 2) applying force to the stamp wafer 230 against the assembly substrate wafer 210 (approximately 3000 newtons for a 3" wafer); and, 3) cooling the polymer layer 220 down below the glass transition temperature.

Other methods for stamping recesses in deformable layers are known in the art, for example, such as those described in U.S. Pat. No. 4,912,844, which is incorporated herein by reference, and may be used in accordance with embodiments of the present invention.

Figure 5D:
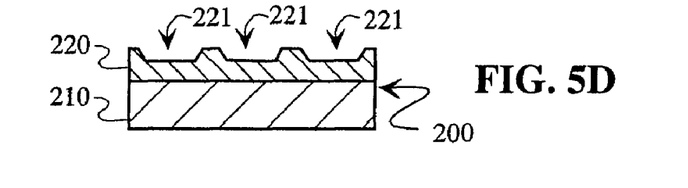

After the polymer layer 220 is molded with the stamp pattern 231, the stamp wafer 230 and the assembly substrate wafer 210 with the now-stamped polymer layer 220 are separated. If curing of the polymer layer 220 is required, the assembly substrate wafer 210 and polymer layer 220 combination may be baked at a temperature required to harden the layer 220 or the layer 220 may be exposed to ultraviolet light if photo-curing is needed. Alternatively, the polymer layer 220 may be left to cool and will harden as it cools. FIG. 5D shows the polymer layer 220 on top of the assembly template wafer 210 with the complementary-shaped receptacles 221. The combination of the shaped polymer layer 220 with the assembly substrate wafer 210 provides an assembly template 200, which is used in additional steps of an embodiment of the present invention, as described below.

Another method for forming an assembly template comprises forming recesses in a silicon wafer. An embodiment of this method is depicted in FIGS. 13A-13E. Preferably, a two-step, deep reactive ion etch (DRIE) process is used to create three-dimensionally shaped receptacles in a silicon wafer surface. The DRIE process is well known in the art. The receptacles each preferably consist of a primary cavity shape having a circular base and secondary alignment structures comprising rectangularly shaped bars.

Figure 13A:
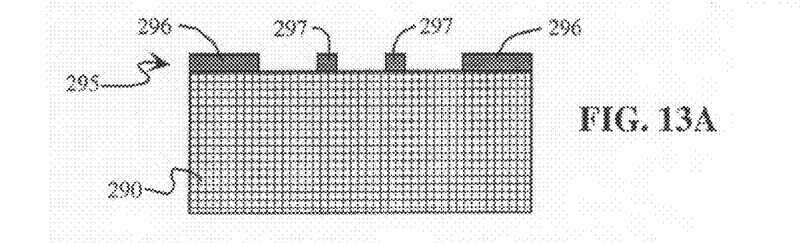
FIGS. 13A-13E illustrate the steps for the fabrication of an assembly template in accordance with another embodiment of the present invention.

FIG. 13A shows the application of a masking layer 295 to the silicon wafer 290 for producing the primary cavity 293 and the secondary alignment key structures 294 of a receptacle. The primary cavity 293 and the secondary alignment key structures 294 are shown in FIG. 13E, in which it can be seen that the secondary alignment structures 294 are located at the bottom of the primary cavity 293. The masking layer 295 comprises photoresist that defines the regions for removing the silicon surface material, preferably using a DRIE process. Specifically, the masking layer comprises an outside portion 296 that defines the outer perimeter of the primary cavity 293 and inner portions 297 that define the perimeters of the secondary alignment key structures.

Figure 13B:
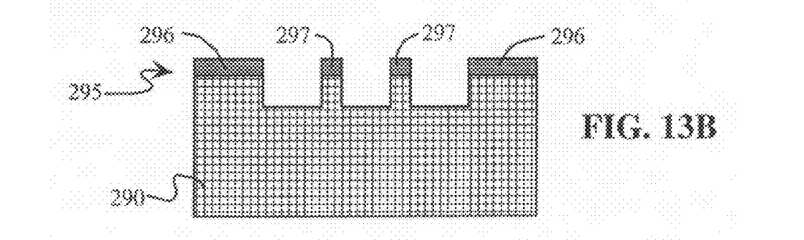

FIG. 13B depicts the DRIE process for forming the primary cavity 293 and the secondary alignment key structures 294. The DRIE process removes the unmasked regions of the silicon wafer 290 and the material under the mask layer 295 is left in place. The DRIE process may be performed in a commercially available system such as the Unaxis DRIE system from Unaxis of St. Petersburg, Fla. The Unaxis system uses an etching process known in the art as the Bosch process. An advantage of the Bosch process is that it provides the ability to generate structures with preferred nearly vertical sidewall profiles.

Figure 13C:
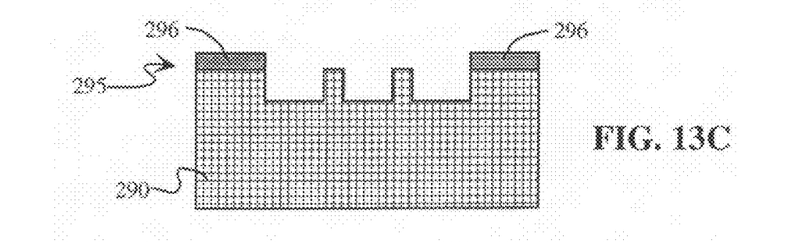

FIG. 13C shows a second patterning step that also uses photoresist materials. The masking layer 295 is removed and then reapplied so that only the outer portion 296 is present. Hence, the material of the silicon wafer 290 corresponding to the secondary alignment key structures 294 is left uncovered. This pattern of the mask layer 295 is then used for translating the secondary alignment key structures 294 to the bottom of the primary cavity 293.

Figure 13D:
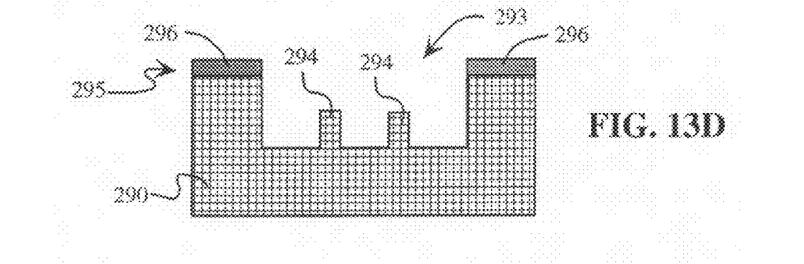
Figure 13E:
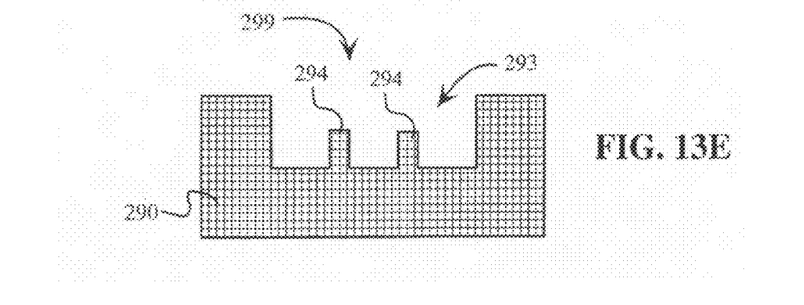

FIG. 13D depicts the second application of the DRIE process for translating the secondary alignment structures 294 to the bottom of the primary cavity 293. FIG. 13E shows the resulting receptacle 299 after the mask layer 295 is removed. As can be seen from FIG. 13E, the double etch process provides for creating a three-dimensional receptacle 299 with secondary alignment key structures 294 having heights that are less than the depth of the primary cavity 293. FIG. 13E shows a primary cavity 293 with two alignment key structures 294. Other receptacle shapes according to embodiments of the present invention are described in additional detail below.

Populating the Assembly Template

The next major step for fabricating device microstructures comprises populating the assembly template with the individual microstructures. Preferably, fluidic self-assembly methods are used to populate the assembly template with the individual semiconductor structures. As discussed above, there are basically two approaches for fluidic self-assembly known in the art, which differ in the underlying mechanism used to locate, position, and connect the components into the larger system. The first approach utilizes chemically based driving forces to govern the assembly process (i.e., attraction, positioning, orientation, and ordering are controlled by molecular interactions at the surfaces of the objects). Embodiments of this first approach are described by Karl F. Bohringer et al., in "Modeling of Capillary Forces and Bind Sites for Fluidic Self-Assembly," *MEMS* 2001: *The 14th IEEE International Conference on Micro Electro Mechanical Systems,* 2001, pages 369-374. The second approach uses gravitational forces and geometrical constraints (i.e., shaped components and complementary-shaped receptacle sites). The methods discussed below for populating the assembly template use geometrically patterned semiconductor structures and, therefore, employ the second approach. However, those skilled in the art will appreciate that the assembly template of embodiments of the present invention may be populated by methods that employ the first approach.

Figure 6A:
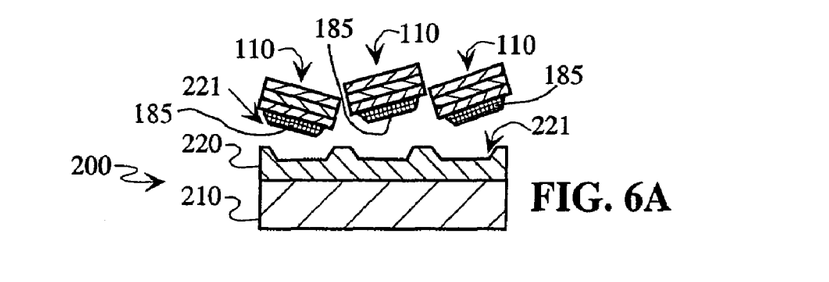
FIGS. 6A-6B illustrate steps for populating an assembly template having the receptacles depicted in FIGS. 5A-5D with the microstructures having the alignment structures depicted in FIGS. 4A-4I.
Figure 6B:
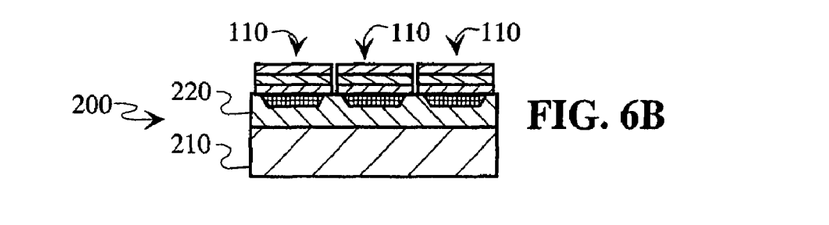

FIGS. 6A-6B schematically illustrate the preferred steps for populating the assembly template 200 with the individual microstructures 110. In a preferred embodiment, the individual microstructures 110 are delivered to the assembly template 200 using a fluidic self-assembly process (FSA) process. As shown in FIG. 6A, an ethanol slurry may be used to flow the individual microstructures 110 with the geometrically pattern alignment structures 185 over the polymer layer 220 with the shaped receptacles 221. The alignment structures 185 of the individual microstructures 110 access the complementary-shaped receptacles 221 in the assembly template 200. A multiple step assembly sequence may be used where individual microstructures 110 having alignment structures 185 with different shapes and sizes are to be applied to the assembly template, where the microstructures 110 having larger alignment structures 185 are applied to the assembly template 200 before microstructures 110 with smaller alignment structures 185 are applied.

FIG. 6B shows the individual microstructures 110 after their alignment structures 185 have been seated in the complementary shaped receptacles 221. Additional techniques, such as vibrating the assembly template 200, may be used to ensure that the alignment structures 185 of individual microstructures 110 are properly seated in the assembly template 200. Copending patent application "Improved Self-Location Apparatus" describes an apparatus for applying the individual microstructures to a substrate wafer by tilting and rotating the wafer and also applying vibrational energy to the wafer.

Alignment Structures

Figure 7:
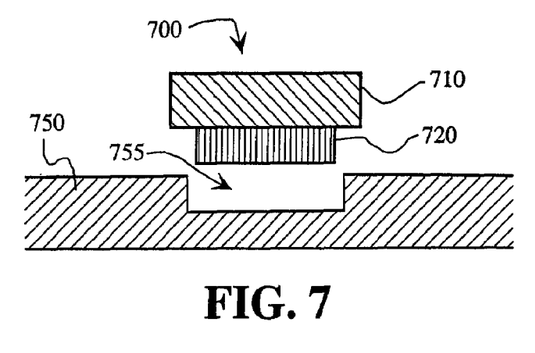
FIG. 7 shows a simplified representation of a microstructure having an alignment structure according to an embodiment of the present invention.

FIG. 7 shows a simplified representation of a microstructure 700 comprising a semiconductor structure 710 coupled to an alignment structure 720. The microstructure is positioned above an assembly template 750 with a corresponding complementary-shaped receptacle 755. As briefly discussed above, prior art apparatus and methods typically do not provide for a specific orientation of the alignment structure 720 within the complementary-shaped receptacle 755 by self-location techniques. If, for example, the geometrically patterned alignment structure 720 has a square shape with four equal length sides, it is immediately apparent that the alignment structure 720 may be positioned within the receptacle 755 in any one of four orientations. This variation in orientation generally complicates the fabrication of the device or module having several microstructures and/or reduces the number of usable microstructures positioned on an assembly template.

Therefore, it is preferred that the alignment structure 720 and the complementary-shaped receptacle 755 have shapes that result in a single orientation of the microstructure 700. Preferably, the alignment structure 720 has a perimeter that is slightly smaller than the perimeter of the complementary-shaped receptacle 755. This will reduce the possibility that the alignment structure 720 will bind in the receptacle 755. However, the smaller the perimeter of the alignment structure 720 in relation to the receptacle 755, the less precise the positioning and orientation of the alignment structure 720 in the receptacle 755.

FIGS. 8A-8D illustrate sample shapes of the alignment structure 720 to provide for a single orientation of the microstructure 700 when positioned within a complementary-shaped receptacle 755. One skilled in the art will understand that FIGS. 8A-8D do not show all shapes that provide for a unique orientation of the microstructure 700, but that these shapes provide examples of shapes according to embodiments of the present invention. In general, FIGS. 8A-8D show that an embodiment of an alignment structure according to the present invention comprises one or more structures with generally polygonal-shaped contours, where the sides of the polygonal-shaped contours may comprise straight lines, curved lines, and/or lines having other shapes.

Figure 8A:
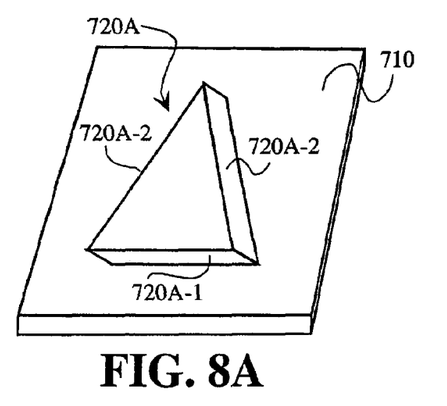
FIGS. 8A-8D illustrate exemplary shapes for alignment structures according to embodiments of the present invention.

FIG. 8A shows a triangular-shaped alignment structure 720A positioned on the semiconductor structure 710. To provide for a unique orientation of the microstructure 700, the triangular-shaped structure 720A must have a base side 720A-1 with a different length than the two other sides 720A-2 of the structure 720A. The complementary-shaped receptacle 755 would have a corresponding triangular shape to receive the alignment structure 720A.

Figure 8B:
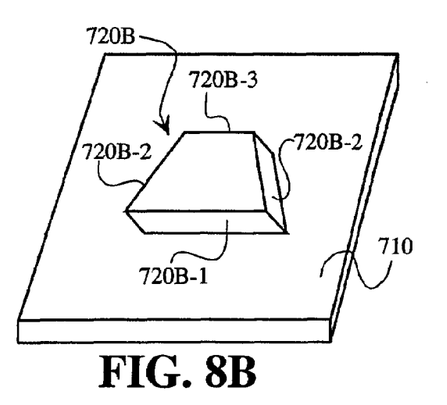

FIG. 8B shows a trapezoidal-shaped alignment structure 720B positioned on the semiconductor structure 710. To provide for a unique orientation of the microstructure 700, the trapezoidal-shaped structure 720B should have a base side 720B-1 with a different length than the top side 720B-2 opposite the base side 720B-1. The remaining sides 720B-3 of the structure 720B preferably have lengths different than the base side 720B-1 and the top side 720B-2. Again, the complementary-shaped receptacle 755 for receiving the alignment structure 720B would also have a corresponding trapezoidal shape.

Figure 8C:
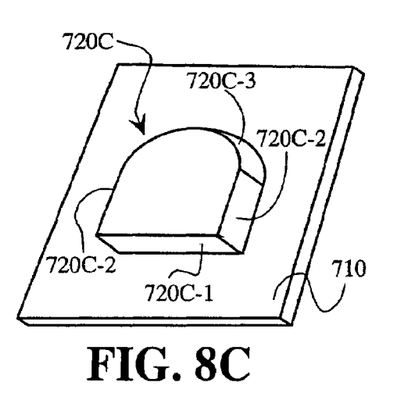

FIG. 8C shows that alignment structures according to embodiments of the present invention are not limited to structures having straight sides. FIG. 8C shows an embodiment of an alignment structure 720C where at least one of the sides is not a straight line. The alignment structure 720C has a generally rectangular shape with a straight line base 720C-1 and two other sides 720C-2 comprising straight lines. However, the top side 720C-3 of the structure 720C opposite the base 720C-1 has a curved shape. This curved shape may facilitate the positioning of the alignment structure 720C within a complementary-shaped receptacle 755 by reducing the number of sharp edges in the receptacle 755 that may cause the alignment structure 720C to catch on a edge rather than properly seating in the receptacle 755. Those skilled in the art will understand that variations of the alignment shape depicted in FIG. 8C may have multiple curved sides or sides with other than straight line edges.

Figure 8D:
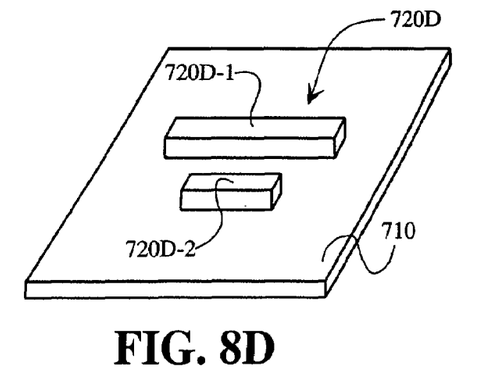

FIG. 8D shows an alignment structure 720D comprising two separate substructures 720D-1, 720D-2 disposed on the semiconductor structure 710. These two substructures 720D-1, 720D-2 have different shapes, sizes, and/or orientations to ensure that the microstructure 700 has a unique orientation when positioned in a receptacle 755. FIG. 8D shows that a first substructure 720D-1 comprises a rectangular-shaped structure and that a second substructure 720D-2 comprises a shorter rectangular-shaped structure disposed parallel to the first substructure 720D-1. Those skilled in the art will understand that the substructures may have different shapes or sizes than those depicted in FIG. 8D. Further, those skilled in the art will understand that the substructures may be disposed in some orientation other than the parallel orientation depicted in FIG. 8D. Finally, those skilled in the art will understand that more than two substructures may be used to comprise the alignment structure 720D. In essence, FIG. 8D shows that a plurality of alignment substructures may be used with a plurality of corresponding complementary-shaped subreceptacles to obtain the desirable unique orientation of the microstructure 700.

As indicated above, some embodiments of the present invention comprising an alignment structure and a corresponding complementary-shaped receptacle may still have a problem of properly seating the microstructures within with the receptacles. The edges of the alignment structure may improperly engage with the receptacle so that the microstructure actually tilts into the receptacle rather than properly seats. Further, if the alignment structure is positioned at the corresponding complementary-shaped receptacle in a different orientation than the receptacle, the alignment structure may not seat at all within the receptacle, reducing the yield for the process.

Figure 9A:
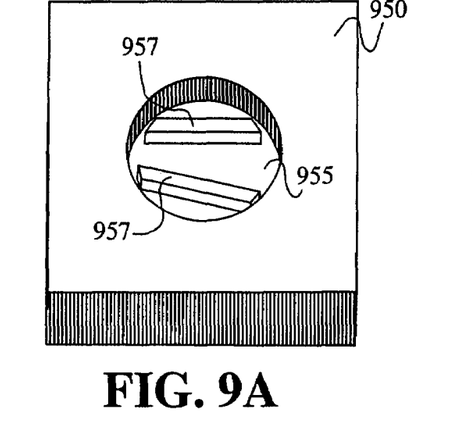
FIG. 9A shows a top view of an assembly template according to an embodiment of the present invention.
Figure 9B:
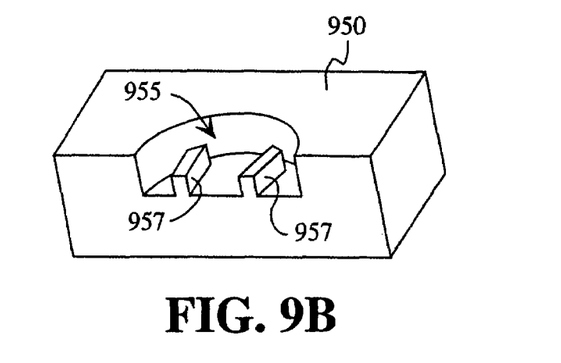
FIG. 9B shows a cross-section view of the receptacle depicted in FIG. 9A.

Other embodiments according to the present invention provide that an alignment structure may be initially captured by a receptacle and then properly oriented within the receptacle. FIG. 9A shows a receptacle 955 within an assembly template 950. The receptacle 955 has one or more secondary receptacle structures 957 disposed in the receptacle 955. The secondary receptacle structures 957 are configured to provide a secondary alignment structure that mates with complementary structures within primary alignment structure disposed on a microstructure. FIG. 9B shows a cross-sectional slice of the receptacle 955. FIG. 9B further shows that the secondary receptacle structures 957 preferably comprise protuberances that project from the bottom of the receptacle 955.

Figure 10A:
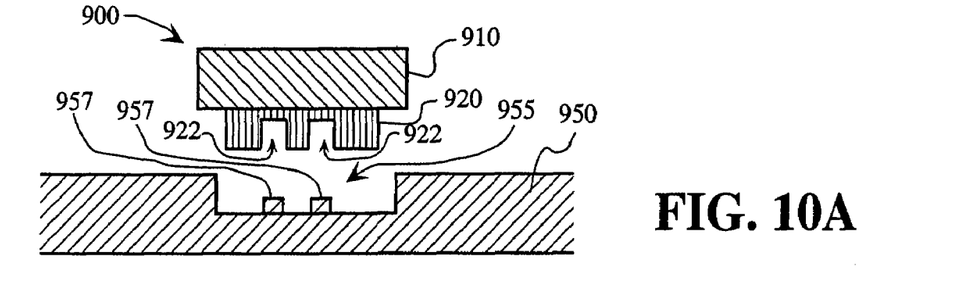
FIGS. 10A-10C show the steps for seating a microstructure having an alignment structure according to an embodiment of the present invention in the complementary-shaped receptacle depicted in FIGS. 9A and 9B.
Figure 10B:
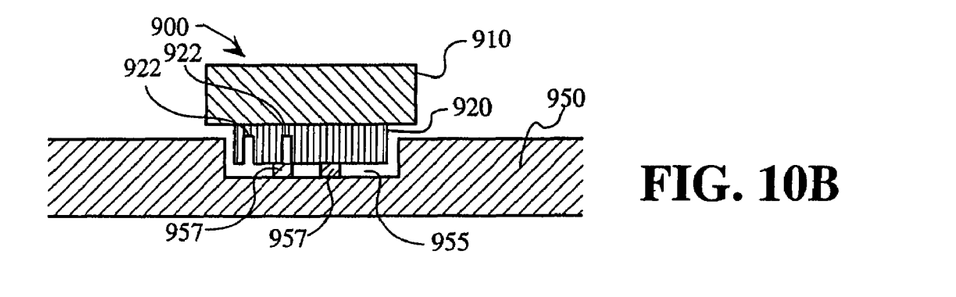
Figure 10C:
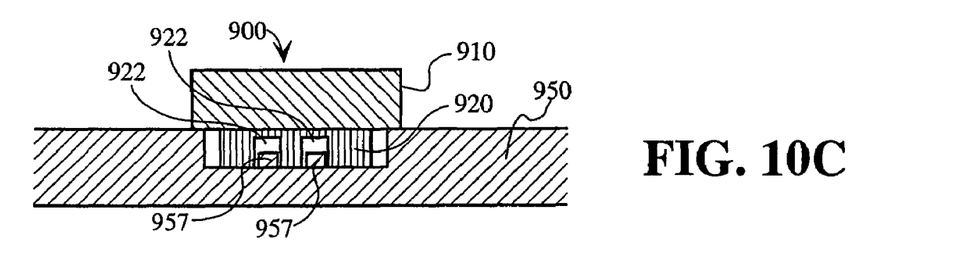

FIGS. 10A-10C show the steps for seating a microstructure 900 having a primary alignment structure 920 in a receptacle 955 having the secondary receptacle structure 957 according to an embodiment of the present invention. FIG. 10A shows the primary alignment structure 920 positioned above the receptacle 955. The primary alignment structure 920 has one or more recesses 922 that have a complementary shape to the secondary receptacle structures 957 within the receptacle 955.

FIG. 10B shows the microstructure 900 after the primary alignment structure 920 has been initially seated within the receptacle 955. As shown in FIG. 10B, the primary alignment structure 920, while seated within the receptacle 955, will be initially positioned on top of the secondary receptacle structures 957. Hence, the one or more recesses 922 will not be mated with the secondary receptacle structures 957.

FIG. 10C shows the microstructure 900 after it has been repositioned so that the one or recesses 922 mate with the secondary receptacle structures 957. Hence, the primary alignment structure 920 is fully seated within the complementary shaped receptacle 955. As shown in FIG. 10C, the bottom of the primary alignment structure 920 rests on or near the bottom of the receptacle 955 when the microstructure 900 is properly oriented and seated.

Figure 11A:
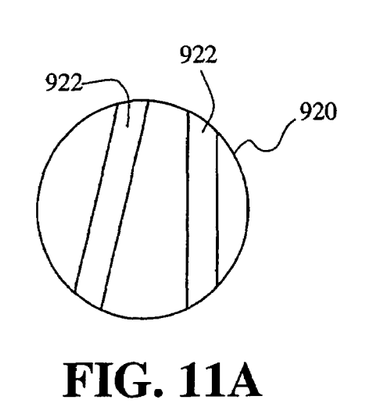
FIG. 11A shows a top view of a simplified representation of the alignment structure depicted in FIGS. 10A-10C.
Figure 11B:
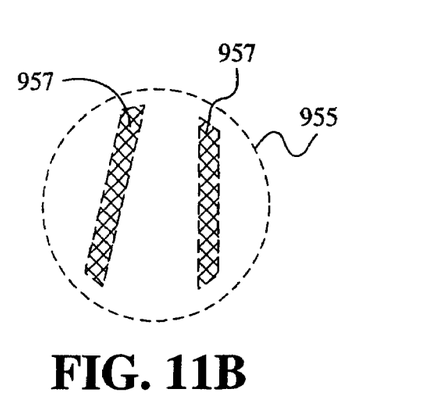
FIG. 11B shows a top view of a simplified representation of the receptacle depicted in FIGS. 9A-9B and FIGS. 10A-10C.

FIGS. 11A-11D show a top view of the primary alignment structure 920 and the complementary-shaped receptacle 955 shown in FIGS. 10A-10C and the process of mating the two. FIG. 11A shows a top view of the primary alignment structure 920 with one or more recesses 922 that mate with the secondary receptacle structures 957. FIG. 11B shows a top view of the complementary-shaped receptacle 955 with one or more secondary receptacle structures 957.

FIGS. 11A and 11B also illustrate that the preferred shapes for the receptacle 955 and primary alignment structure 920 are circular. The circular shapes facilitate the capture of the primary alignment structure 920 without the primary alignment structure 920 becoming tilted or stuck in the receptacle 955. Further, the circular shapes facilitate the rotation of the primary alignment structure 920 in the receptacle 955 so that the secondary receptacle structure 957 in the receptacle 955 can mate with the recesses 922 in the primary alignment structure 920.

Figure 11C:
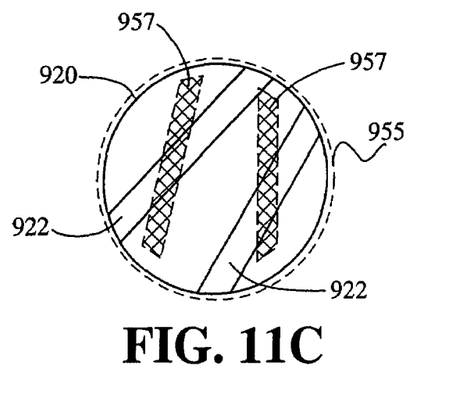
FIGS. 11C-11D show a top view of the steps depicted in FIGS. 10A-10C for seating a microstructure having an alignment structure in a complementary-shaped receptacle.

FIG. 11C shows the primary alignment structure 920 when it is initially positioned within the complementary-shaped receptacle 955. As shown in FIG. 11C, the primary alignment structure 920 is held within the receptacle 955, but the secondary receptacle structures 957 and complementary-shaped recesses 922 prevent the microstructure 900 from being positioned at the wrong orientation. Due to the circular shapes of the receptacle 955 and the primary alignment structure 920, the primary alignment structure 920 may still rotate within the receptacle 955. Rotation of the primary alignment structure 920 may be accomplished by vibrating the assembly template which contains the receptacle 955.

Figure 11D:
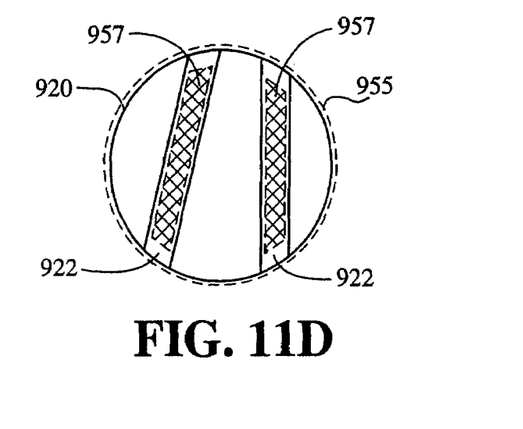

FIG. 11D shows the final position of the primary alignment structure 920 within the receptacle 955. As shown in FIG. 11D, the secondary receptacle structures 957 of the receptacle 955 mate with the recesses 922 in the primary alignment structure 920 to provide the desired and unique orientation of the associated microstructure 900.

Figure 14:
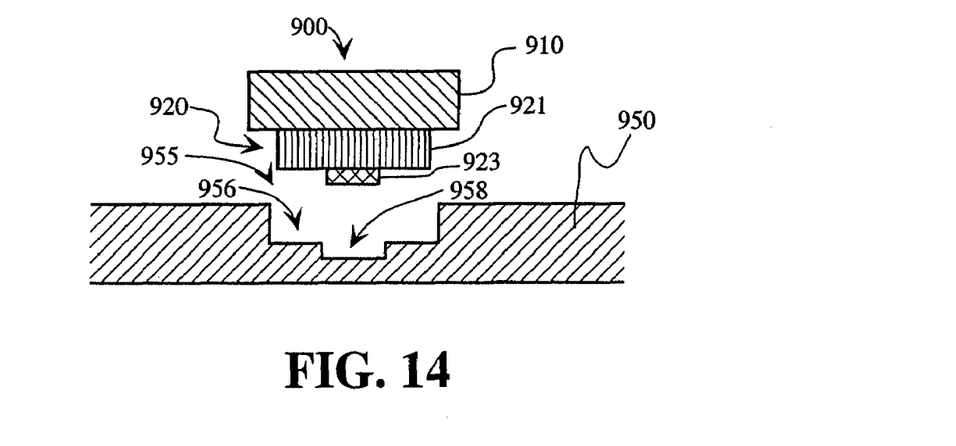
FIG. 14 shows an alternative embodiment of an alignment structure and a complementary-shaped receptacle according to the present invention.

FIG. 14 illustrates an alternative embodiment according to the present invention. As shown in FIG. 14, a complementary-shaped receptacle 955 comprises a first recess 956 and a second recess 958 disposed within the first recess 956. The alignment structure 920, which mates with the receptacle 955, comprises a first structure 921 and a second structure 923 that protrudes from the first structure 921. The first recess 956 and the first structure 921 have the same general shape and size so that the alignment structure 920 can initially mate with the receptacle 955. Preferably, the first recess 956 and the first structure 921 have a circular shape to facilitate the final mating of the alignment structure 920 with the receptacle 955 in the manner as described above.

The second recess 958 and the second structure 923 are also complementary shaped. However, the shape of the second recess 958 and the second structure 923 are chosen so that the associated microstructure obtains a unique orientation when the alignment structure 920 is fully seated within the receptacle 955. The shape of the second recess 958 and the second structure 923 may comprise any shape that provides for a single orientation, for example, those shapes discussed in relation to FIGS. 8A, 8B and 8C. The second recess 958 and the second structure 923 may also comprise a plurality of structures, as, for example, shown in FIG. 8D.

In accordance with some embodiments of the present invention, cutting and/or etching semiconductor materials, or using other semiconductor fabrication techniques on semiconductor materials may form the alignment structures discussed above. Similarly, the receptacles discussed above may be directly formed in a substrate of semiconductor material, such as discussed above in regard to FIGS. 13A-13E.

However, it is preferred that the alignment structures be created through the use of polymer materials and the receptacles formed on a silicon wafer. That is, the alignment structures may be formed of polymer materials as discussed above in relation to FIGS. 12A-12H. The receptacles may be formed on a silicon wafer as discussed above in relation to FIGS. 13A-13E.

From the foregoing description, it will be apparent that the present invention has a number of advantages, some of which have been described above, and others of which are inherent in the embodiments of the invention described above. Also, it will be understood that modifications can be made to the method, structure, or apparatus described above without departing from the teachings of subject matter described herein. As such, the invention is not to be limited to the described embodiments except as required by the appended claims.

What is claimed is:

1. An electronic module comprising:
 a device microstructure having an alignment structure, the alignment structure having a selected size and shape; and
 a substrate having at least one receptacle, the at least one receptacle having a size and shape complementary to the size and shape of the alignment structure,
 wherein the device microstructure is configured to be seated within the at least one receptacle at a single orientation, the single orientation of the device microstructure based on the shape of the alignment structure and the shape of the at least one receptacle;
 wherein the alignment structure comprises:
  a first structure projecting from the device microstructure, and
  one or more alignment structure recesses in said first structure; and
 wherein the at least one receptacle comprises:

a receptacle recess shaped to mate with said first structure, and one or more receptacle structures projecting from said recess, said one or more receptacle structures shaped to mate with said one or more alignment structure recesses in said first structure.

2. The module according to claim 1, wherein the alignment structure comprises a single structure projecting from the device microstructure, the single structure having a contour that varies when rotated 360°.

3. The module according to claim 2, wherein the contour is shaped as a polygon, the polygon having at least one side with a length different than the lengths of the other sides of the polygon.

4. The module according to claim 2, wherein the contour has multiple edges and at least one edge is a curved edge.

5. The module according to claim 1, wherein the alignment structure comprises multiple structures projecting from the device microstructure.

6. The module according to claim 5, wherein the multiple structures comprise a first rectangular structure having a first length and a second rectangular structure having a second length shorter than the first length.

7. The module according to claim 1, wherein the alignment structure comprises:

a first structure projecting from the device microstructure and one or more second structures projecting from the first structure, and the at least one receptacle comprises:

a first receptacle recess shaped to mate with said first structure and one or more second receptacle recesses disposed within said first receptacle recess, the one or more second receptacle recesses shaped to mate with the one or more second structures.

8. The module according to claim 7 in which the first receptacle recess is wider than the first structure, the one or more second structures projecting from the first structure having ends disposed on a plane perpendicular to a longitudinal axis of the first structure, the first receptacle recess having a flat bottom parallel to a longitudinal axis of the first receptacle recess, the one or more second receptacle recesses being disposed in the bottom of the first receptacle recess, the ends of the one or more second structures and the bottom of the first receptacle recess being disposed so that the ends of the one or more second structures may rest on the bottom of the first receptacle recess while the first structure rotates in the first receptacle recess until the one or more second receptacle recesses mate with the one or more second structures.

9. The module according to claim 1, wherein the at least one receptacle comprises one or more recesses formed in a silicon wafer.

10. The module according to claim 9, wherein the one or more recesses are formed in the silicon wafer using a deep reactive ion etch process.

11. The module according to claim 1, wherein said first structure and said receptacle recess have circular shapes.

12. The module according to claim 1, wherein at least one receptacle structure has a contour with a polygonal shape.

13. The module according to claim 1, wherein the one or more receptacle structures comprise a pair of rectangular shaped structures, the rectangular structures disposed in said receptacle recess at an angle to each other.

14. The module according to claim 1, wherein said alignment structure comprises polymer material.

15. The module according to claim 1, wherein the at least one receptacle comprises one or more recesses stamped in a polymer layer.

16. The module according to claim 1, wherein said module further comprises:

a plurality of device microstructures, each device microstructure having an alignment structure, and a plurality of receptacles, said plurality of device microstructures being seated in said plurality of receptacles and said plurality of receptacles being configured to receive the alignment structures of said device microstructures.

17. The module according to claim 1, wherein the alignment structure comprises a polymer layer applied to the microstructure and stamped into the selected size and shape.

18. The module according to claim 1, wherein the alignment structure comprises a polymer layer applied to the microstructure and patterned into the selected size and shape using a photolithographic process.

19. The module according to claim 1, wherein the alignment structure has a perimeter that is smaller than the perimeter of the complementary-shaped receptacle.

20. The module according to claim 1, wherein the shape of the alignment structure and the shape of the one complementary-shaped receptacle are selected so that the alignment structure can be seated in the one complementary-shaped receptacle without tilting.

21. The module according to claim 1 in which the receptacle recess is wider than the first structure, the one or more receptacle structures comprise one or more protuberances that project from a bottom of the receptacle recess and have ends disposed on a plane perpendicular to a longitudinal axis of the receptacle recess, the first structure has a flat end disposed on a plane perpendicular to a longitudinal axis of the first structure, the ends of the protuberances and the flat end of the first structure being disposed so that the flat end of the first structure may rest on the ends of the protuberances while the first structure rotates in the receptacle recess until the one or more alignment structure recesses in the first structure mate with the one or more receptacle structures projecting from the receptacle recess.

22. An electronic module comprising:

an alignment structure formed on a device microstructure, the alignment structure comprising a first alignment structure projecting from the device microstructure; and one or more alignment structure recesses in the first alignment structure;

one or more receptacles formed in a substrate, the one or more receptacles each comprising a first receptacle recess having a bottom, the first receptacle recess being shaped and sized so as to be capable of receiving said first alignment structure and facilitating the rotation of the first alignment structure when at least part of the first alignment structure is initially received in the first receptacle recess, and one or more receptacle structures projecting from the bottom of the first receptacle recess, the one or more receptacle structures shaped to mate with the one or more alignment structure recesses in the first alignment structure;

wherein the shape of the one or more alignment structure recesses and the shape of the one or more receptacle structures are selected so that the alignment structure can only be seated in the one or more receptacles at a single orientation.

23. The module according to claim 22 wherein the first receptacle recess has a generally circular shape and has a diameter greater than any width of the first alignment structure.

24. The module according to claim 22 in which the first alignment structure has a generally circular shape and has a diameter smaller than any width of the first receptacle recess.

25. An electronic module comprising:

a device microstructure having an alignment structure, said alignment structure having a selected size and shape and including a first structure with one or more alignment structure recesses formed therein; and a substrate having at least one receptacle, said at least one receptacle having a size and shape complementary to said size and shape of said alignment structure and including a receptacle recess shaped to mate with said first structure and one or more receptacle structures projecting from said recess, said one or more receptacle structures shaped to mate with said one or more alignment structure recesses in said first structure, and said device microstructure being configured to be seated within said at least one receptacle at a particular orientation based on the shape of the alignment structure and the shape of the at least one receptacle.

* * * * *